United States Patent [19]

Etter

[11] Patent Number: 5,617,019
[45] Date of Patent: Apr. 1, 1997

[54] INDUCTIVE MEASURING DEVICE FOR MEASURING ALTERNATING CURRENT COMPONENTS SUPERPOSED TO A HIGH DIRECT CURRENT

[75] Inventor: Marcel Etter, Troinex, Switzerland

[73] Assignee: Liaisons Electroniques-Mecaniques LEM S.A., Plan-Les-Quates, Switzerland

[21] Appl. No.: 604,673

[22] Filed: Feb. 21, 1996

[30] Foreign Application Priority Data

Feb. 23, 1995 [CH] Switzerland ................ 525/95

[51] Int. Cl.[6] ............... G01R 19/00; G01R 33/00
[52] U.S. Cl. ............. 324/117 R; 324/127; 324/126
[58] Field of Search ................ 324/117 R, 127, 324/126, 250, 254, 260, 244, 117 H, 253

[56] References Cited

U.S. PATENT DOCUMENTS 4,682,101  7/1987  Cattaneo .................. 324/117 H
4,961,049  10/1990  Ghislantoni .................. 324/117 H

*Primary Examiner*—Kenneth A. Wieder
*Assistant Examiner*—Barry C. Bowser
*Attorney, Agent, or Firm*—Woodard, Emhardt, Naughton Moriarty & McNett

[57] ABSTRACT

A direct current of high intensity having alternating current components superposed thereon is flowing in a conductor 1 through a magnetic circuit 5, 6. Two measuring coils 7, 8 are arranged inside opposite air-gaps of the magnetic circuit and are connected in an electric measuring circuit in series with each other and in parallel to voltage dividers 12, 13 and 14, 15. The alternating current components induce voltages in the coils 7 and 8 which add up, the sum thereof appearing across the series-connection of resistors 13, 15. This voltage is integrated by an integrating circuit 10 and then filtered in a band-pass filter 11. The magnetic circuit 5, 6 is screened by lateral screening members 30, 31 so that the remaining field lines of a lateral parasitic magnetic field produce in the magnetic circuit flux portions which are approximately equal and which are added to the useful flux in one air-gap and are substracted from the useful flux in the other air-gap.

12 Claims, 2 Drawing Sheets

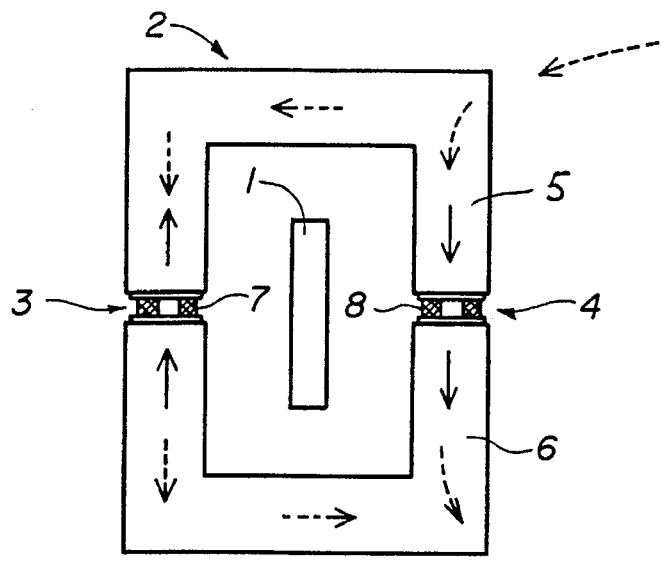
FIG. 1
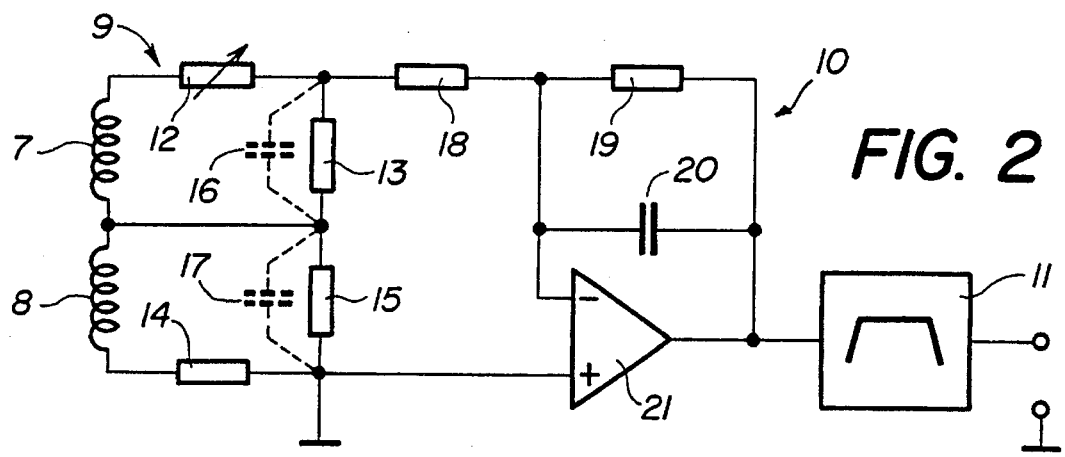
FIG. 2
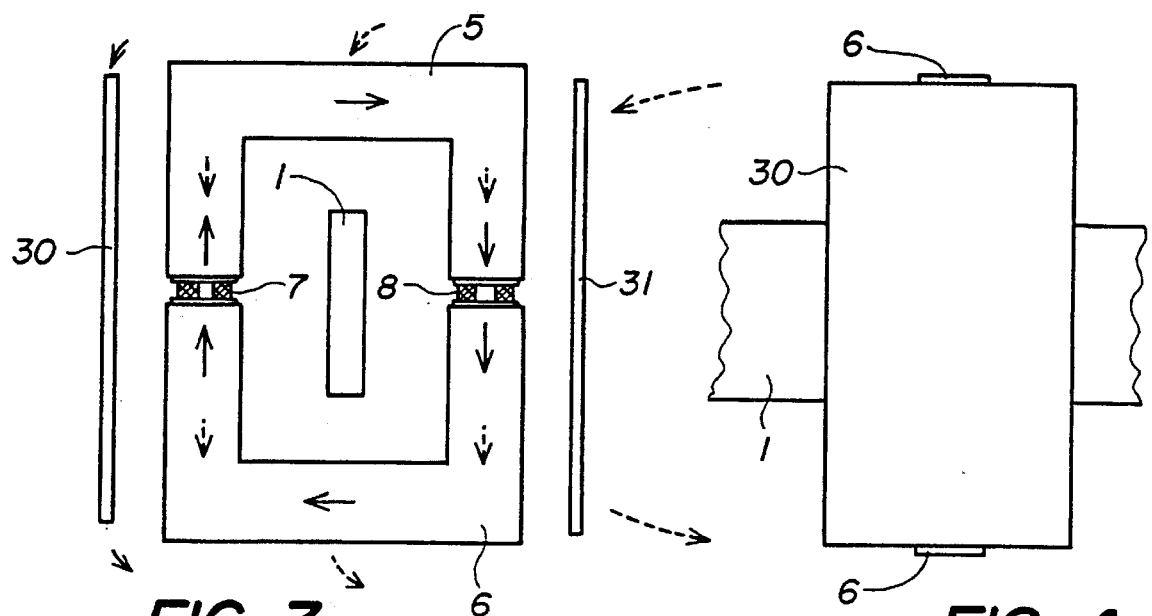
FIG. 3
FIG. 4

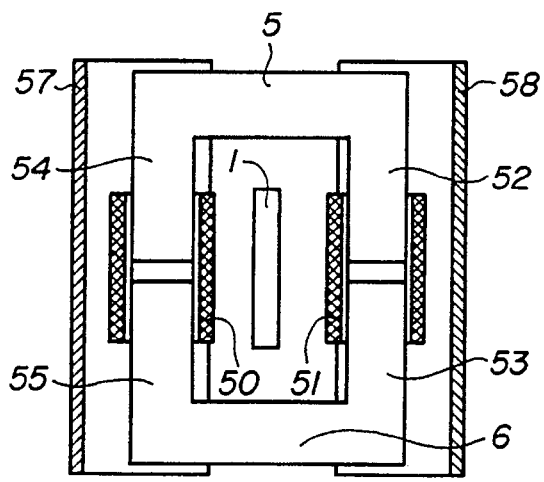
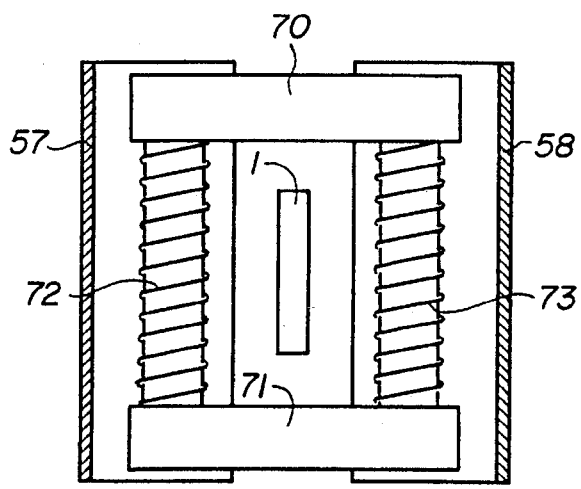
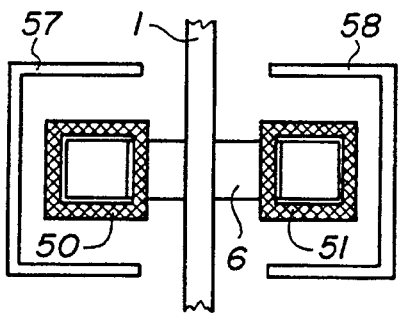
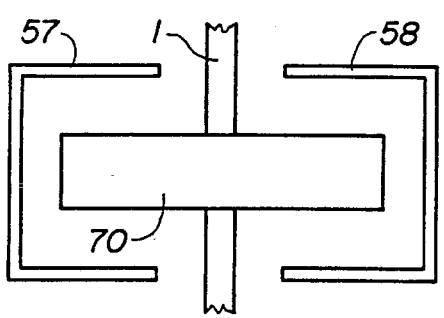
FIG. 5
FIG. 7
FIG. 6
FIG. 8
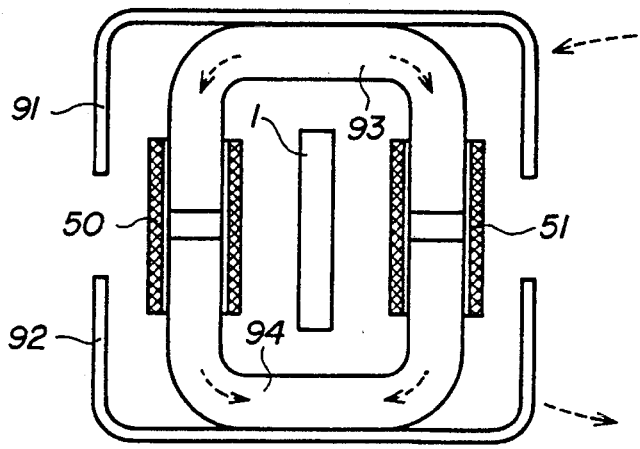
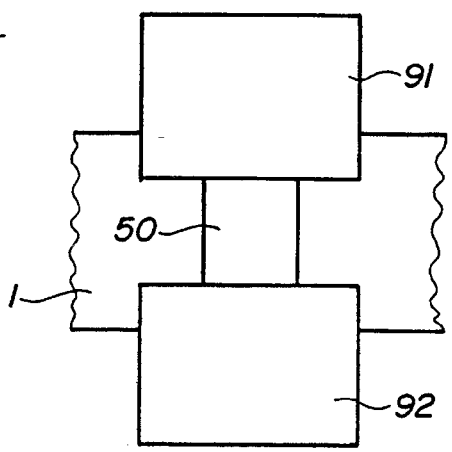
FIG. 9
FIG. 10

INDUCTIVE MEASURING DEVICE FOR MEASURING ALTERNATING CURRENT COMPONENTS SUPERPOSED TO A HIGH DIRECT CURRENT

FIELD OF THE INVENTION

This invention is directed to a current measuring device of the type comprising a magnetic circuit arranged for surrounding a conductor in which flows the current to be measured and at least one measuring coil coupled to this magnetic circuit and connected to an electric measuring circuit. More particularly, the invention relates to the measuring of alternating current components superposed to a direct power current.

BACKGROUND AND SUMMARY OF THE INVENTION

An inductive measuring device of the above type provides a galvanic separation of the current to be measured from the measuring circuit which is essential when high currents are concerned.

A drawback of these devices in the case of high currents is the risk that the magnetic circuit used becomes saturated. This can be overcome by providing an air-gap in the magnetic circuit. On the other hand, the presence of an air-gap renders the measuring device sensitive to the influence of parasitic outer magnetic fields.

The invention provides a measuring device for alternating components superposed to a high direct current, such as a power current, which avoids a saturation of the magnetic measuring circuit while reducing to a minimum the influence of parasitic magnetic fields on the result of the measure.

To this effect, the measuring device according to the invention comprises a magnetic measuring circuit which is substantially symmetrical with respect to at least one cross-sectional plane thereof and has two air-gaps of same dimensions formed on either side of said plane of symmetry. This measuring device further comprises two substantially identic measuring coils coupled with the magnetic measuring circuit and an electric measuring circuit coupled to these two coils, the measuring circuit comprising adding means for adding the voltages induced, respectively, into the two measuring coils by the alternating current components and an integrating circuit connected to the adding means for receiving a current representative of the sum of these induced voltages.

The measuring coils of the device according to the invention are preferably connected in series and each of the measuring coils is preferably connected in parallel with a respective voltage divider, at least one of these voltage dividers being adjustable, and the integrating circuit is connected to a series connection of two resistors of same value which are part, respectively, of each of the voltage dividers.

According to a preferred embodiment of the invention, a band-pass filter is connected to the integrating circuit and arranged for filtering the frequencies of the alternating current components to be measured.

According to a preferred embodiment of the invention, the measuring coils are arranged, respectively, inside the air-gaps of the magnetic circuit.

According to another preferred embodiment, the measuring coils are arranged, respectively, around portions of the magnetic circuit between which the air-gaps are formed.

According to an embodiment of the invention, the magnetic circuit can comprise two U-shaped parts of same dimensions, the ends of said parts being arranged opposite each other for forming the air-gaps.

In a preferred embodiment of the invention, screening means are provided which include two screening members of a magnetically permeable material arranged, respectively, at the outside of the magnetic circuit at a determined distance from the air-gaps.

According to a particular embodiment of the invention, the screening members comprise plates or sheets arranged, respectively, in planes substantially parallel to the plane of symmetry of the magnetic circuit, the dimensions of the screening members in these planes being substantially greater than the dimensions of the air-gaps.

According to another preferred embodiment of the invention, the screening members comprise plates or sheets having each a portion arranged in a respective plane parallel to the plane of symmetry of the magnetic circuit and portions bent to partially surround the air-gaps.

According to yet another preferred embodiment, the screening members comprise plates or sheets having each a portion in contact with the magnetic circuit in the vicinity of sections of that circuit lying in the plane of symmetry of the same.

BRIEF DESCRIPTION OF THE DRAWINGS

FIG. 1 is a schematic front view of a magnetic circuit according to a first embodiment of the measuring device according to the invention;

FIG. 2 is an electric diagram illustrating the principle of an electric measuring circuit of a device according to the invention;

FIGS. 3 and 4 are, respectively, front and side views of a magnetic circuit according to FIG. 1 provided with screening members;

FIGS. 5 and 6 are, respectively, a front view, partially in section, and a view from above of a magnetic circuit of another embodiment of a device according to the invention;

FIGS. 7 and 8 are views similar to those of FIGS. 5 and 6 illustrating another embodiment of a device according to the invention;

FIGS. 9 and 10 are, respectively, a front view, partially in section, and a side view of a magnetic circuit with screening members according to another embodiment of the present invention.

DETAILED DESCRIPTION OF PREFERRED EMBODIMENTS

As shown in FIG. 1, a conductor 1 is surrounded by a magnetic circuit 2 having two air-gaps 3 and 4 between U-shaped parts 5 and 6 of the magnetic circuit. Measuring coils 7 and 8 are arranged, respectively, inside the air-gaps 3 and 4.

FIG. 2 shows an electric diagram of a measuring circuit 9 comprising the measuring coils 7 and 8. These measuring coils are connected in series, the direction of winding and the connection of these coils to each other being such that the voltages induced, respectively, in each of these coils by an alternating current flowing in the conductor 1, add up between the outer terminals of the series connection of 7 and 8. Each coil is connected in parallel with a respective voltage divider 12, 13 and 14, 15. The resistors 13 and 15 are mounted in series and have equal, very high values. At least one of the resistors 12 and 14 is adjustable so that in the presence of an outer alternating magnetic field, the voltages of opposite phases appearing across the terminals of each of the resistors 13 and 15 can be adjusted so that the sum thereof becomes zero. Furthermore, adjustable capacitors 16 or 17 can be connected in parallel to resistors 13 or 15 so that a possible phase difference between the voltages across the terminals of resistors 13 and 15 can be compensated. The present measuring device can thus be rendered practically entirely immune against parasitic magnetic fields.

The diagram of FIG. 2 further shows an integrating circuit 10 connected through a resistor 18 to the terminals of the series-connection of resistors 13 and 15. This integrating circuit comprises a resistor 19, a condenser 20, and an operational amplifier 21 having a small offset voltage. The resistor 19 which limits the drift of the output of the amplifier 21 has a very high value to avoid errors in the integration at the frequencies of the voltage to be measured. The voltage induced in the coils 7 and 8 being proportional to the derivative with respect to time of the alternating current to be measured, the integration by the circuit 10 provides at the output thereof a voltage proportional to the current to be measured. The output of the integrating circuit 10 is applied to a band-pass filter 11 which filters the frequency components of the alternating current to be measured.

The components which are to be measured by the present measuring device are superposed to a direct current of very high intensity as compared to the intensity of these components. The magnetic circuit is designed by the choice of its material, by its dimensions and by the dimensions of its air-gaps so that it will not become saturated by the flux produced by this high direct current. The flux produced by the alternating current components which appears at a given moment in the magnetic circuit 2 is indicated in FIG. 1 by arrows in continuous lines. Furthermore, FIG. 1 shows in a simplified way the influence of an outer magnetic field represented schematically by arrows in dotted lines. This field produces a flux in the magnetic circuit which, in an ideal case, is divided equally between the branches of the magnetic circuit which contain the air-gaps 3 and 4. Therefore, in the instantaneous situation represented, the influence of this outer magnetic field results in the air-gap 4 in a field which adds up with the field produced by the current of the conductor 1, while it is directed in the opposite direction thereto in the air-gap 3. Similarly, at any moment, the sum of the voltages induced in the two coils does not exhibit any components due to the outer field. A good approximation to this ideal case can be obtained if one uses for the magnetic circuit 2 a material of high permeability, such as ferronickel. However, such a material has generally a relatively low saturation level which limits the possibilities of application of the measuring device. The high costs of such materials of high permeability is also a disadvantage. If, on the other hand, a material is used the saturation level of which is high and the permeability of which at small amplitudes of the flux is relatively low, there is a risk that the influence of an outer magnetic field is different in the two air-gaps of the magnetic circuit since a parasitic flux produced by a lateral outer field, as illustrated in FIG. 1, follows pathes of different lengths in the magnetic circuit.

To improve the behaviour of the measuring device in this latter case, a magnetic screening can be used in the form of two plates of a magnetically permeable material, for example, of an ordinary ferro-magnetic steel sheet.

FIGS. 3 and 4 show an embodiment in which two plates 30, 31 are arranged in a direction parallel to the branches of the magnetic circuit containing the air-gaps at a certain distance therefrom. FIG. 3 shows the influence of an outer parasitic magnetic field coming from one side, the field lines of which and the corresponding flux inside the magnetic circuit having been represented schematically as in FIG. 1 by arrows in dotted lines, while the flux produced by an alternating current flowing in the conductor 1 is shown by arrows in continuous lines. It can be seen that a great part of the outer magnetic field is short-circuited in the lateral screening plate 31 and that the other field lines end, as shown in FIG. 3, on the one hand, at the upper part 5 of the magnetic circuit so that the corresponding flux is divided into two portions which are practically equal and of same direction in both air-gaps, and end, on the other hand, for a very small part at the opposite screening plate 30.

FIGS. 5 and 6 show another embodiment of the present device according to which the measuring coils have the shape of elongated coils 50, 51 which surround the air-gaps of the magnetic circuit. With such coils, a higher induced voltage can be obtained from the current to be measured as compared to the case of coils arranged inside the air-gaps. FIGS. 5 and 6 further show screening means formed by two sheet members which, in this case, are bent so as to laterally surround the portions of the magnetic circuit forming the air-gaps.

FIGS. 7 and 8 show a magnetic circuit comprising two parallel parts 70, 71, between the ends of which coils 72 and 73 without ferro-magnetic cores are inserted. In such an arrangement, a screening of the same type as that of FIGS. 5 and 6 is particularly useful to avoid a direct influence of outer magnetic fields on the measuring coils and to guarantee an approximately symmetric distribution of the flux produced by an outer magnetic field the field lines of which end on the magnetic circuit.

FIGS. 9 and 10 show another arrangement of screening means for providing an approximately symmetric distribution of the parasitic fluxes in the magnetic circuit. Sheets 91, 92 are bent to form pieces with a U-shaped profile and are arranged to be in contact with opposite portions 93, 94 of the magnetic circuit which do not contain the airgaps. In such a manner, the field lines of an outer parasitic field ending on the screening members produce flux portions in the magnetic circuit parts containing the air-gaps, the ratio of which does not depend on the configuration of the parasitic outer magnetic field.

In the various embodiments described above, similar parts have been designated by the same reference numerals. The proportions of the different pieces shown in the drawings to illustrate preferred embodiments are only given by way of example and can be adapted depending on the conditions prevailing in a given application.

What is claimed is:

1. An inductive measuring device for measuring alternating current components superposed to a high direct current flowing in a conductor, comprising a magnetic circuit which is substantially symmetrical with respect to at least one cross-sectional plane thereof and is arranged for surrounding said conductor, said magnetic circuit having two air-gaps of same dimensions formed on either side of said plane of symmetry, said device further comprising two substantially identic measuring coils coupled with said magnetic circuit and an electric measuring circuit coupled to said two coils, said measuring circuits comprising adding means for adding the voltages induced, respectively, in said two measuring coils by the said alternating current components, and an integrating circuit connected to said adding means for receiving a current representative of the sum of said induced voltages.

2. A measuring device according to claim 1, wherein said measuring coils are connected in series.

3. A measuring device according to claim 1, wherein the measuring circuit comprises a band-pass filter connected to said integrating circuit and arranged for filtering the frequencies of said alternating current components to be measured.

4. A measuring device according to claim 1, wherein each of said measuring coils is connected in parallel with a respective voltage divider, at least one of said voltage dividers being adjustable, said integrating circuit being connected to a series-connection of two resistors of same value which are part, respectively, of each of said voltage dividers.

5. A measuring device according to claim 4, wherein at least one adjustable capacitor is connected in parallel with at least one of said resistors of same value.

6. A measuring device according to claim 1, wherein said measuring coils are arranged, respectively, inside said air-gaps.

7. A measuring device according to claim 1, wherein said measuring coils are arranged, respectively, around portions of said magnetic circuit between which said air-gaps are formed.

8. A measuring device according to claim 1, wherein said magnetic circuit comprises two U-shaped parts of same dimensions, the ends of said parts being arranged opposite each other for forming said air-gaps.

9. A measuring device according to claim 1, comprising screening means including two screening members of a magnetically permeable material arranged, respectively, at the outside of said magnetic circuit at a determined distance from said air-gaps.

10. A measuring device according to claim 9, wherein said screening members comprise plates or sheets arranged, respectively, in planes substantially parallel to said plane of symmetry, the dimensions of said screening members in said planes being substantially greater than the dimensions of said air-gaps.

11. A measuring device according to claim 9, wherein said screening members comprise plates or sheets and have each a portion arranged in a respective plane parallel to said plane of symmetry and portions bent to at least partially surround said air-gaps.

12. A measuring device according to claim 9, wherein said screening members comprise plates or sheets having each a portion in contact with said magnetic circuit in the vicinity of sections of said circuit which lie in said plane of symmetry.

* * * * *

UNITED STATES PATENT AND TRADEMARK OFFICE
CERTIFICATE OF CORRECTION

PATENT NO. : 5,617,019
DATED : April 1, 1997
INVENTOR(S) : Marcel ETTER

It is certified that error appears in the above-indentified patent and that said Letters Patent is hereby corrected as shown below:

On the title page:

Item: 73 please delete "Plan-Les-Quates" and insert in lieu thereof --Plan-Les-Ouates--.

Signed and Sealed this

Twelfth Day of August, 1997

*Attest:*

BRUCE LEHMAN

*Attesting Officer*   Commissioner of Patents and Trademarks